United States Patent
Meade (10) Patent No.: US 9,612,413 B2
(45) Date of Patent: *Apr. 4, 2017

(54) METHOD AND APPARATUS PROVIDING A COUPLED PHOTONIC STRUCTURE

(71) Applicant: MICRON TECHNOLOGY, INC., Boise, ID (US)

(72) Inventor: Roy Meade, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 14/632,434

(22) Filed: Feb. 26, 2015

(65) Prior Publication Data

US 2015/0177470 A1 Jun. 25, 2015

Related U.S. Application Data

(62) Division of application No. 13/452,064, filed on Apr. 20, 2012, now Pat. No. 8,995,805.

(51) Int. Cl.
*G02B 6/42* (2006.01)
*H01L 31/0232* (2014.01)
*H01L 31/101* (2006.01)

(52) U.S. Cl.
CPC ......... *G02B 6/4295* (2013.01); *G02B 6/4203* (2013.01); *G02B 6/4289* (2013.01); *G02B 6/4291* (2013.01); *H01L 31/02327* (2013.01); *H01L 31/101* (2013.01)

(58) Field of Classification Search
None
See application file for complete search history.

(56) References Cited

U.S. PATENT DOCUMENTS

| | | | |
|---|---|---|---|
| 3,982,123 A | 9/1976 | Goell et al. | |
| 4,824,199 A | 4/1989 | Uken | |
| 5,193,131 A | 3/1993 | Bruno | |
| 5,942,771 A * | 8/1999 | Ishimura | H01L 31/0232 257/184 |
| 6,353,250 B1 * | 3/2002 | Fukano | H01L 31/02161 257/184 |

(Continued)

FOREIGN PATENT DOCUMENTS

| | | |
|---|---|---|
| CN | 1238744 C | 1/2006 |
| CN | 101356699 A | 1/2009 |

(Continued)

OTHER PUBLICATIONS

Chen et al., "Integrated GH$_z$ silicon photonic interconnect with micrometer-scale modulators and detectors," School of Electrical and Computer Engineering, Cornell University, Ithaca, NY 14853, Aug. 17, 2009, vol. 17, Optics Express 15248-15256.

(Continued)

*Primary Examiner* — Hemang Sanghavi
(74) *Attorney, Agent, or Firm* — Perkins Coie LLP (57) ABSTRACT

Described embodiments include optical connections for electronic-photonic devices, such as optical waveguides and photonic detectors for receiving optical waves from the optical waveguides and directing the optical waves to a common point. Methods of fabricating such connections are also described.

13 Claims, 7 Drawing Sheets

(56) References Cited

U.S. PATENT DOCUMENTS

| | | | |
|---|---|---|---|
| 6,483,098 B1* | 11/2002 | Kato | G02B 6/4214 |
| | | | 250/214.1 |
| 6,617,568 B1* | 9/2003 | Matsuda | H01L 31/03528 |
| | | | 250/214 R |
| 6,681,069 B2 | 1/2004 | Galarza et al. | |
| 6,957,006 B2 | 10/2005 | Terakawa et al. | |
| 6,991,892 B2 | 1/2006 | Block et al. | |
| 7,298,949 B2 | 11/2007 | Gothoskar et al. | |
| 7,613,369 B2 | 11/2009 | Witzens et al. | |
| 8,148,794 B2 | 4/2012 | Masini et al. | |
| 8,401,350 B2 | 3/2013 | Okayama | |
| 8,633,067 B2 | 1/2014 | Assefa et al. | |
| 8,909,021 B2 | 12/2014 | Sugawara | |
| 8,995,805 B2* | 3/2015 | Meade | G02B 6/4291 |
| | | | 385/14 |
| 2002/0158268 A1* | 10/2002 | Matsuda | H01L 31/02162 |
| | | | 257/184 |
| 2003/0026515 A1 | 2/2003 | Barenburg et al. | |
| 2004/0022495 A1 | 2/2004 | Shapiro et al. | |
| 2004/0179806 A1 | 9/2004 | Block et al. | |
| 2004/0185386 A1 | 9/2004 | Block | |
| 2006/0118893 A1 | 6/2006 | Behfar et al. | |
| 2006/0198569 A1 | 9/2006 | Ohtsu et al. | |
| 2008/0192241 A1 | 8/2008 | He | |
| 2009/0283679 A1* | 11/2009 | Murayama | H01L 31/0203 |
| | | | 250/338.1 |
| 2009/0297099 A1 | 12/2009 | Benjamin et al. | |
| 2009/0324164 A1 | 12/2009 | Reshotko et al. | |
| 2011/0012221 A1 | 1/2011 | Fujikata et al. | |
| 2011/0170819 A1 | 7/2011 | Zheng et al. | |
| 2011/0233708 A1* | 9/2011 | Washino | H01L 31/02161 |
| | | | 257/436 |

FOREIGN PATENT DOCUMENTS

| | | |
|---|---|---|
| EP | 0 331 338 A2 | 9/1989 |
| EP | 331338 A2 | 9/1989 |
| GB | 1 525 985 | 9/1978 |
| JP | 20011296456 A | 10/2001 |
| JP | 2003307603 A | 10/2003 |
| JP | 2004126128 A | 4/2004 |
| JP | 2010186097 A | 8/2010 |
| JP | 2011053595 A | 3/2011 |
| WO | 2011092861 A1 | 8/2011 |

OTHER PUBLICATIONS

Feng et al., "High-speed Ge photodetector monolithically integrated with large cross-section silicon-on—insulator waveguide," Applied Physics Letter 95, 261105, (Dec. 29, 2009), three (3) pages.

Yamada et al., "Si Photonic Wire Waveguide Devices," IEEE Journal of Selected Topics in Quantum Electronics, vol. 12, No. 6, Nov./Dec. 2006, pp. 1371-1379.

Hunsperger, "Waveguide Loss—Bend Loss," Integrated Optics, 4th Edition, pp. 84-87.

Thyagarajan et al., "Accurate Numerical Method for the Calculation of Bending Loss in Optical Waveguides Using a Matrix Approach," Optics Letters, vol. 12, No. 4, Apr. 1987, pp. 296-298.

Verdeyen, "Resonant Optical Cavities," Laser Electronics 1st Edition, pp. 112-121.

Hammer et al., "Total Multimode Reflection at Facets of Planar High-Contrast Optical Waveguides," and E. van Groesen, Journal of Lightwave Technology, vol. 20, No. 8, Aug. 2002, pp. 1549-1555.

Office Action mailed Aug. 5, 2015 in China Application No. 201380020795.6, 13 pages.

Office Action mailed Jan. 21, 2016 in Korean Patent Application No. 10-2014-7032372, 10 pages.

Office Action mailed Oct. 20, 2015 in Japan Application No. 2015-507046, 9 pages.

Office Action mailed Mar. 28, 2016 in China Application No. 201380020795, 14 pages.

* cited by examiner

FIG. 6

METHOD AND APPARATUS PROVIDING A COUPLED PHOTONIC STRUCTURE

CROSS-REFERENCE TO RELATED APPLICATION

The present application is a divisional of U.S. patent application Ser. No. 13/452,064, filed Apr. 20, 2012, the disclosure of which is incorporated herein by reference in its entirety.

TECHNICAL FIELD

Embodiments disclosed herein relate generally to the field of electronic devices (e.g., semiconductor devices) and more particularly to electronic-photonic devices.

BACKGROUND

Optical transmission may be used as a means for communication between separate integrated circuit chips (inter-chip connections) and within components on the same chip (intra-chip connections). Electronic-photonic devices, also known as optoelectronic devices, are a class of electronic devices that are capable of sourcing, controlling, and/or detecting light. Electronic-photonic devices include both electronic and photonic functions. In response to more demanding communication bandwidth, energy consumption, and performance standards for electronic devices such as semiconductor devices, photonic devices are increasingly being integrated with optical/electrical circuits to form a type of electronic-photonic device called an electronic-photonic integrated circuit.

For example, in the semiconductor industry, photonic devices have various applications including communication within a chip, between chips of a computer board, and between computer boards. In chip-to-chip communication via optical interconnects, each chip on the circuit board can be interfaced with a photonic-electronic transmitter-receiver circuit, with two chips operably connected via an optical waveguide. Likewise, optical waveguides may be used to connect components within a chip, such as between an integrated optical source and a photonic detector. Another benefit of electronic-photonic devices is that the elements that perform the pure optical functions, the pure electrical functions and the optoelectronic functions may be formed concurrently, on the same or different substrate, using existing manufacturing processes such as complementary metal oxide semiconductor (CMOS) semiconductor manufacturing processes.

Figure 1:
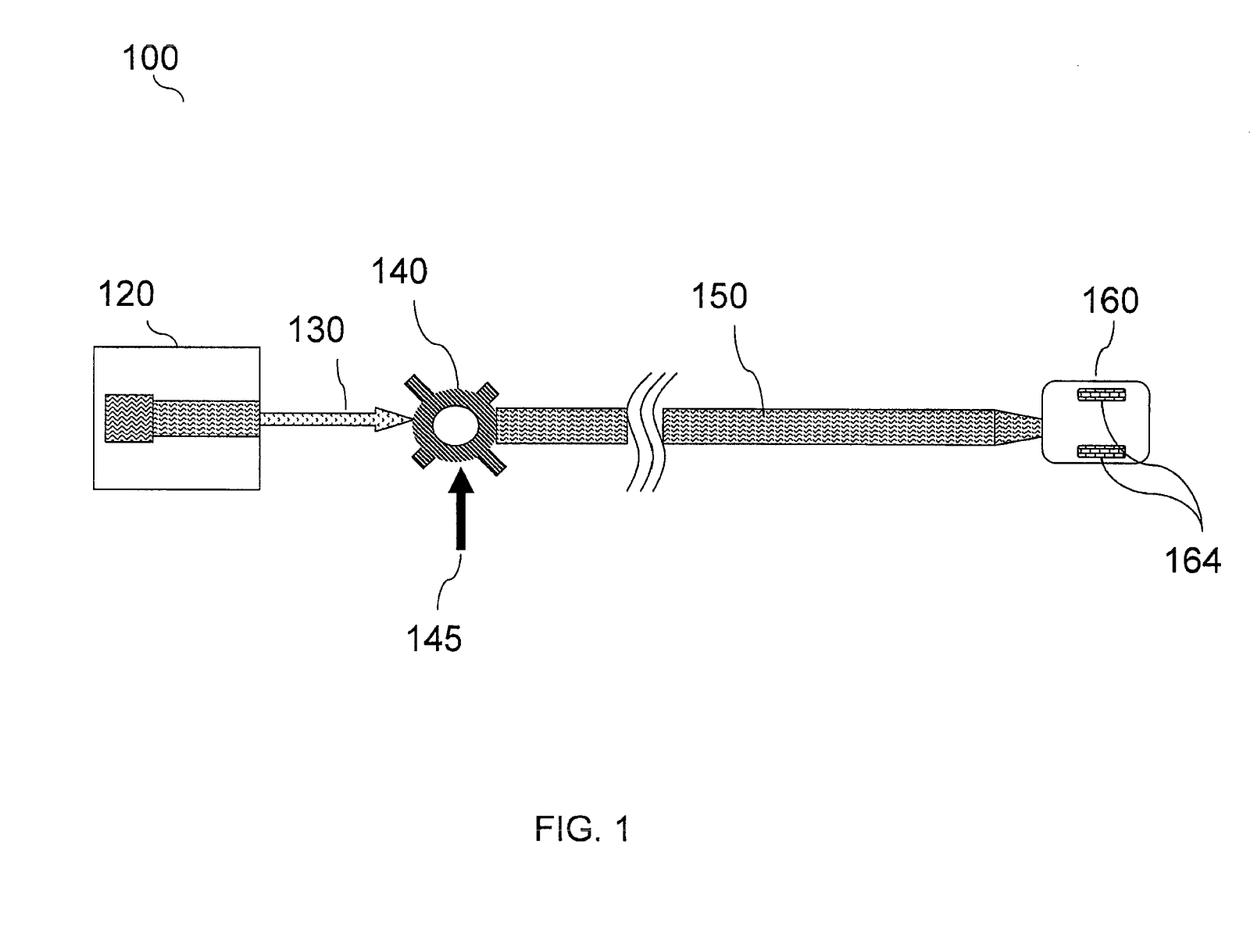
FIG. 1 is a block diagram of a conventional electronic-photonic device.

FIG. 1 illustrates a block diagram of one example of a conventional electronic-photonic device 100. Electronic-photonic device 100 may be used to operably connect elements, such as integrated circuits, on a single chip or substrate, or devices on separate substrates.

Electronic-photonic device 100 includes a light source 120 configured to generate an optical beam. Light source 120 may be, for example, a coherent light source, such as a laser (such as a hybrid silicon laser or a gallium arsenide laser), a coherent light-emitting diode (LED), a superluminescent diode, or other appropriate light source known in the art. A coherent light source is a light source typically having a narrow wavelength band that is consistent and in-phase. Light source 120 may be configured to output an optical beam having a wavelength in a range of approximately 1,200 nm to 1,550 nm.

An optical waveguide 130 connects the optical beam of light source 120 to a modulator 140, such as an optical ring resonator with a PIN junction. Modulator 140 modulates the received light beam with received electrical data 145, and outputs the modulated optical data along another waveguide 150. Modulator 140 is also capable of passing the optical beam through without modulation, such as when the optical beam has already been modulated by another modulator 140 in a same electronic-photonic system.

Photonic detector 160 includes a semiconductor material 162 (such as germanium (Ge), silicon germanium (SiGe), indium gallium arsenide (InGaAs), indium phosphide (InP) or other appropriate materials) that is configured to receive and collect the modulated optical beam. The electrical response is transmitted to one or more electrodes 164 that generate an electrical response upon receiving the energy of the wavelengths of the modulated optical data, and provide an external electrical connection for the received optical data.

Figure 2A:
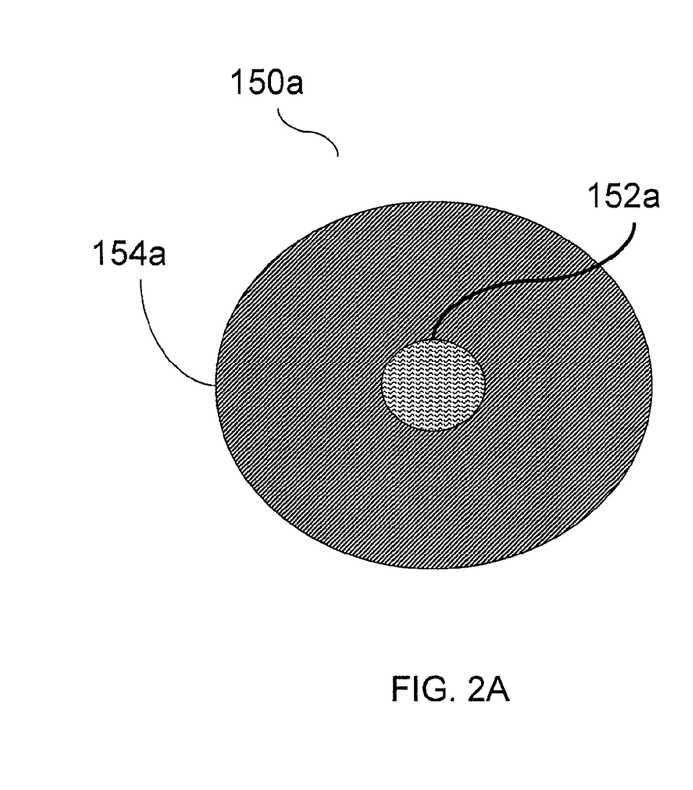
FIGS. 2A and 2B illustrate cross-sectional diagrams of conventional optical waveguides.
Figure 2B:
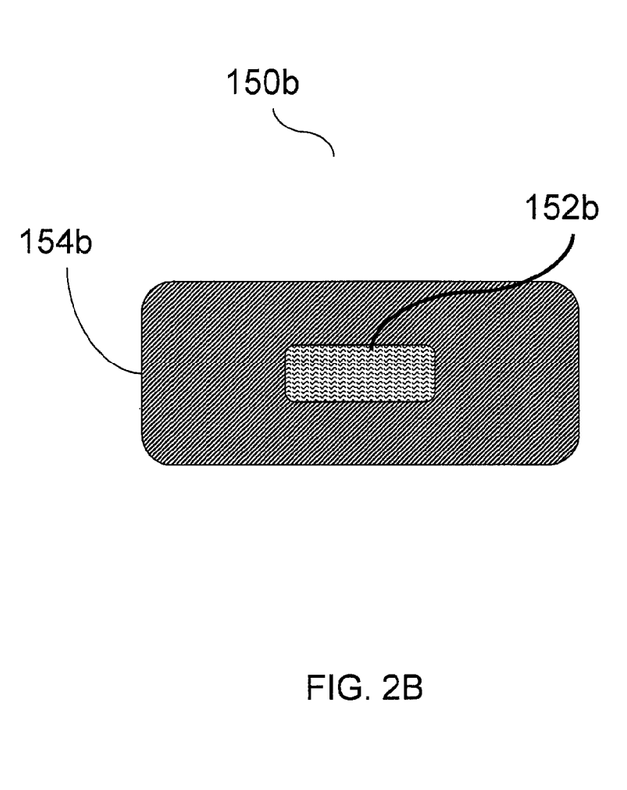

FIGS. 2A and 2B show cross-sectional views of two examples of optical waveguides 150*a*, 150*b*, respectively. Optical waveguides 150*a*, 150*b* both include a respective inner core 152*a*, 152*b* and outer cladding 154*a*, 154*b*.

Optical waveguide 150*a* (FIG. 2A) is an elliptically-shaped optical waveguide. Optical waveguide 150*a* is typical of a waveguide that may be formed as an optical fiber, such as a single mode or multi-mode optical fiber or other element separate from the substrate or chip to which the other photonic devices (e.g., light source 120, photonic detector 160, etc.) are formed. Outer core 154*a* may be, for example, a silicon dioxide ($SiO_2$) material Inner core 152*a* may be, for example, a silicon (Si) material, such as $SiO_2$ doped with impurities such as $GeO_2$, and typically has very small dimensions compared to outer cladding 154*a*. For example, inner core 152*a* may have a radius of approximately 9 μm, while outer cladding 154*a* may have a radius of approximately 125 μm.

Optical waveguide 150*b* (FIG. 2B) is a rectangular-shaped waveguide. Optical waveguide 150*b* is typical of an integrated optical waveguide that may be formed on a semiconductor, such as a silicon substrate, a silicon-on-insulator (SOI) substrate, or a printed circuit board (PCB), using lithographic processing. For example, an integrated optical waveguide 150*b* formed on a $SiO_2$ substrate that acts as the outer cladding 154*b* may have a rectangular inner core 152*b* formed of, for example, a silicon (Si) material. Inner core 152*b* may have a diameter of approximately 300 nm, while outer cladding 154*b* is part of the larger substrate upon which optical waveguide 150*b* is formed and may have a diameter of approximately 1 μm or potentially much larger.

Wave guiding of an optical beam through waveguide 150*a*, 150*b* occurs through internal reflection of electromagnetic waves of an optical beam at the interface between the higher refractive index inner core 152*a*, 152*b* and the lower refractive index outer cladding 154*a*, 154*b*. Inner core 152*a*, 152*b* is formed of a material with a greater refractive index than the index of the material forming the outer cladding 154*a*, 154*b*. The refractive index of inner core 152*a*, 152*b* may be only slightly higher (e.g., 1%) than the refractive index of outer cladding 154*a*, 154*b*, or may be significantly higher (referred to as a "high contrast waveguide") in order to provide greater total internal refraction (TIR). For example, inner core 152*a*, 152*b* may be formed of a silicon (Si) material with a refractive index of approximately 3.5, while outer cladding 154*a*, 154*b* may be formed of a silicon dioxide ($SiO_2$) material with a refractive index of approximately 1.5.

It should be understood that outer cladding 154a, 154b can be formed of any material having a lower refractive index than the index of the inner core 152a, 152b. For example, ambient air, having a refractive index of approximately 1.0, may be used as outer cladding for an optical waveguide 150 having a Si inner core, and thus the cladding need not necessarily use a separate material. It should also be understood that both optical waveguides 130, 150 (FIG. 1) may have similar or different characteristics to those described above in connection with FIGS. 2A and 2B.

Figure 3A:
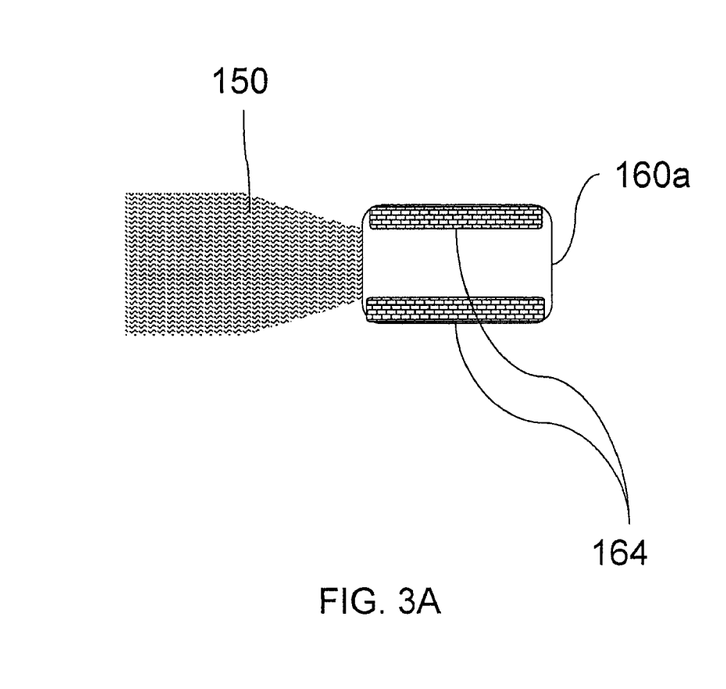
FIGS. 3A and 3B illustrate top-down views of conventional optical connections for an optical waveguide and a photonic detector.
Figure 3B:
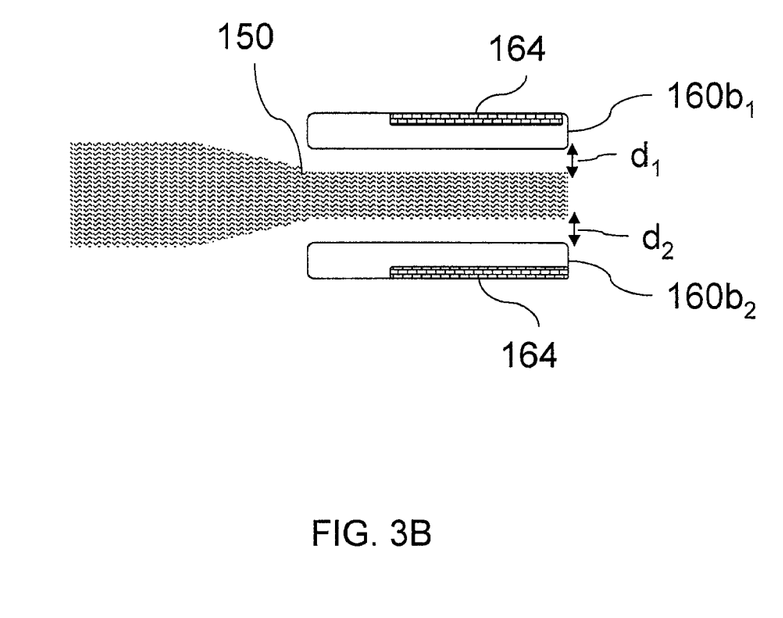

FIGS. 3A and 3B illustrate two top-down views of optical connections between an optical waveguide 150 and a photonic detector 160a, 160b. FIG. 3A shows a photonic detector 160a with optical waveguide 150 butt-coupled to the photonic detector 160a. Butt-coupled connections for photonic detectors require minimal length for the interconnection. However, the different refractive indexes between optical waveguide 150 and the semiconductor material of photonic detector 160a can cause energy from the optical beam to be reflected back into the optical waveguide 150. For example, optical waveguide 150 may be composed of Si having a refractive index of approximately 1.5, while photonic detector 160a may be composed of, e.g., Ge having a refractive index of approximately 4.34. This reflection is known as "return loss," and in addition to diminishing the strength of the optical signal that is received by photonic detector 160a, can interfere with operation of light source 120 (FIG. 1).

FIG. 3B shows a photonic detector 160b with the optical waveguide 150 evanescent-coupled to the photonic detector 160b, which is composed of photonic detector portions $160b_1$ and $160b_2$. Photonic detector portions 160b1, 160b2 surround optical waveguide 150, but are separated from optical waveguide 150 by distances $d_1$, $d_2$, respectively. In evanescent coupling, optical waveguide 150 is placed close to photonic detector portions $160b_1$, $160b_2$ so that an evanescent field (i.e., a near-field standing wave formed at the boundary between inner core 152b and outer cladding 154b of FIG. 5B) generated by the transmission of the optical beam in optical waveguide 150 reaches photonic detector portions $160b_1$, $160b_2$ before fully decaying. Distances $d_1$, $d_2$ must be small enough that the intensity of the evanescent field from optical waveguide 150 does not fully diminish before it is detected by photonic detector portions $160b_1$, $160b_2$. For example, distances $d_1$, $d_2$ may be approximately 10 μm or less. The evanescent field from optical waveguide 150 gives rise to propagating-wave modes on photonic detector portions $160b_1$, $160b_2$, thereby connecting (or coupling) the wave from optical waveguide 150 to photonic detector portions $160b_1$, $160b_2$.

Evanescent-coupled photonic detectors 160b have lower return loss than butt-coupled photonic detectors 160a (FIG. 3A), but typically require longer path-lengths (e.g., approximately 50 μm or more) than butt-coupled photonic detectors 160a. This increases the footprint required for photonic detector 160b and thus the overall size of the electronic-photonic device 100 (FIG. 1).

Accordingly, it is desirable to provide an optical connection between an optical waveguide and a photonic detector with low return loss yet a small path-length.

DETAILED DESCRIPTION

In the following detailed description, reference is made to various embodiments of the invention. These embodiments are described with sufficient detail to enable those skilled in the art to practice them. It is to be understood that other embodiments may be employed, and that various structural, logical and electrical changes may be made. In addition, where various processes are described, it should be understood that the steps of the processes may occur in an order other than how they are specifically described, unless noted otherwise.

Embodiments described herein make advantageous use of a phenomenon known as bending loss that occurs with optical waveguides. When an optical beam travels in an optical waveguide, a near-field standing wave, referred to as an evanescent wave, is formed at the boundary between the inner core and outer cladding of the optical waveguide. When a bend occurs in the optical waveguide, the portion of the evanescent wave located outside of the border between the inner core and the outer cladding must travel faster than the portion of the wave located inside of the inner core, in order to maintain the same angular velocity. At a point referred to as the "critical radius," the evanescent wave cannot travel fast enough in the respective medium to maintain the same angular velocity as the portion of the wave inside of the waveguide, and the energy of this portion propagates outward from the waveguide in a radial direction away from the curved waveguide.

Bending loss is typically considered an obstacle in optical waveguide design. The embodiments described below, however, exacerbate and take advantage of this phenomenon to provide a connection between an optical waveguide and a photonic detector.

Figure 4:
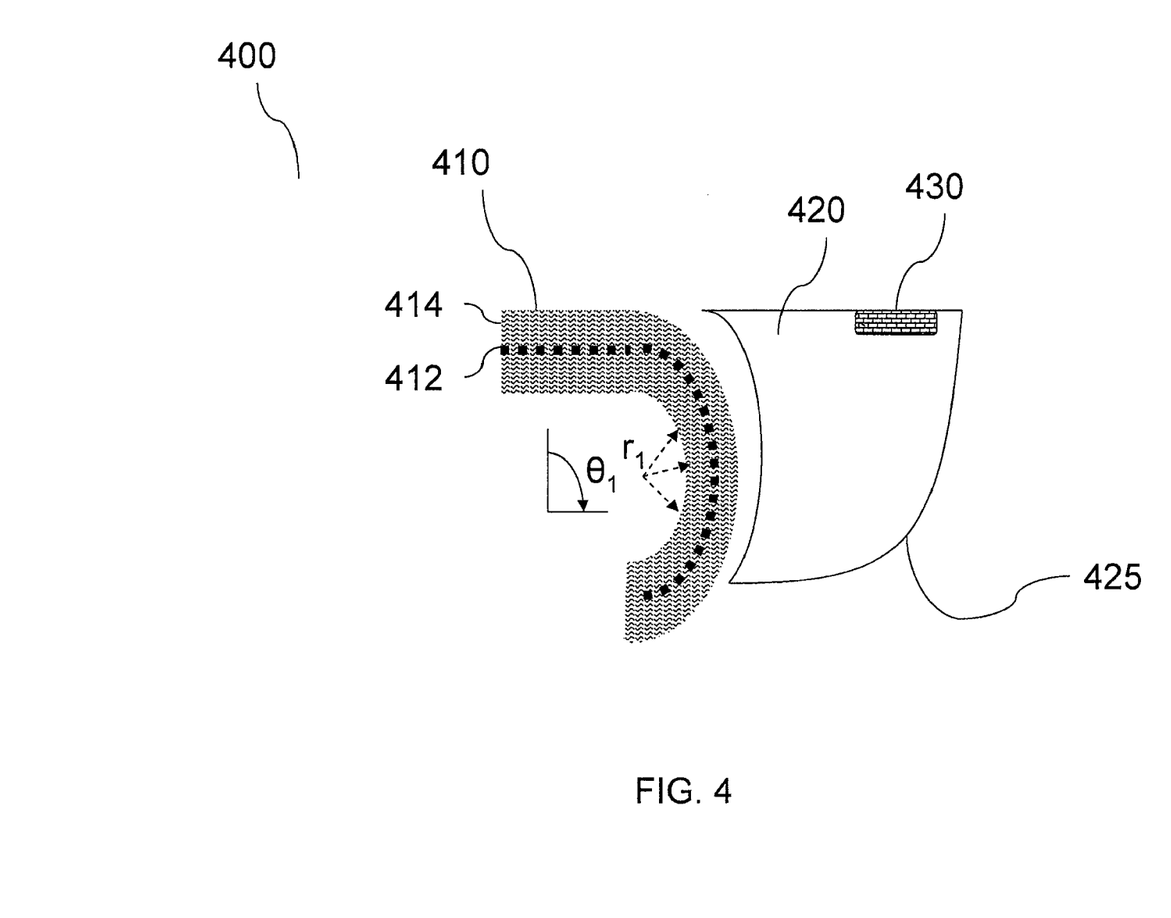
FIG. 4 illustrates a top-down view of an optical connection, in accordance with embodiments described herein.

FIG. 4 illustrates a top-down view of an optical connection 400 between an optical waveguide 410 and a photonic detector 420. Optical connection 400 may be formed, for example, on a substrate such as a silicon substrate, a silicon-on-insulator (SOI) substrate, a silicon dioxide ($SiO_2$) substrate, or a printed circuit board (PCB). Alternatively, elements of optical connection 400 may be formed on multiple separate substrates (e.g., Si, $SiO_2$, SOI, or other suitable substrates).

Optical waveguide 410 includes an internal core 412 and outer cladding 414, and may be integrated into a substrate (e.g., a common substrate with photonic detector 420), or may be, e.g., a single mode or dual mode optical fiber. Inner core 412 may be formed of, for example, a Si material, and have a width of approximately 300 nm Outer cladding 414 may be formed of, for example, $SiO_2$. Inner core 412 may be patterned in outer cladding 414 using known processes.

Photonic detector 420 is composed of a semiconductor material, such as germanium (Ge), silicon germanium (SiGe), indium gallium arsenide (InGaAs), indium phosphate (InP) or other appropriate materials, that generates an electrical response upon receiving an optical wave from optical waveguide 410, as described below. Photonic detector 420 includes at least one electrode 430, which may be composed of a metal such as aluminum, copper, or titanium, for example. Photonic detector 420 may be fabricated using wafer bonding and other existing manufacturing processes such as complementary metal oxide semiconductor (CMOS) semiconductor manufacturing processes.

The operably connected end of optical waveguide 410 is curved at an angle of $\theta_1$, with a corresponding radius of curvature $r_1$. The curved portion of optical waveguide 410 may be formed using a lithographic process. Radius of curvature $r_1$ may be constant along the curve of optical waveguide 410, or alternatively may vary as a function of angle $\theta_1$. If radius of curvature $r_1$ is sufficiently small (i.e., is equal to or less than the "critical radius"), thereby creating a sharp enough curve in optical waveguide 410, the evanescent wave from optical waveguide 410 leaves optical waveguide 410 and propagates radially towards photonic detector 420. The critical radius of waveguide 410 will depend on the width of the inner core 412, and the materials and respective refraction indexes for the inner core 412 and the outer cladding 414. For an optical waveguide 410 including, for example, a 300 nm wide Si inner core 412 and a $SiO_2$ outer cladding, radius $r_1$ may be equal to or less than 1 μm.

Figure 5:
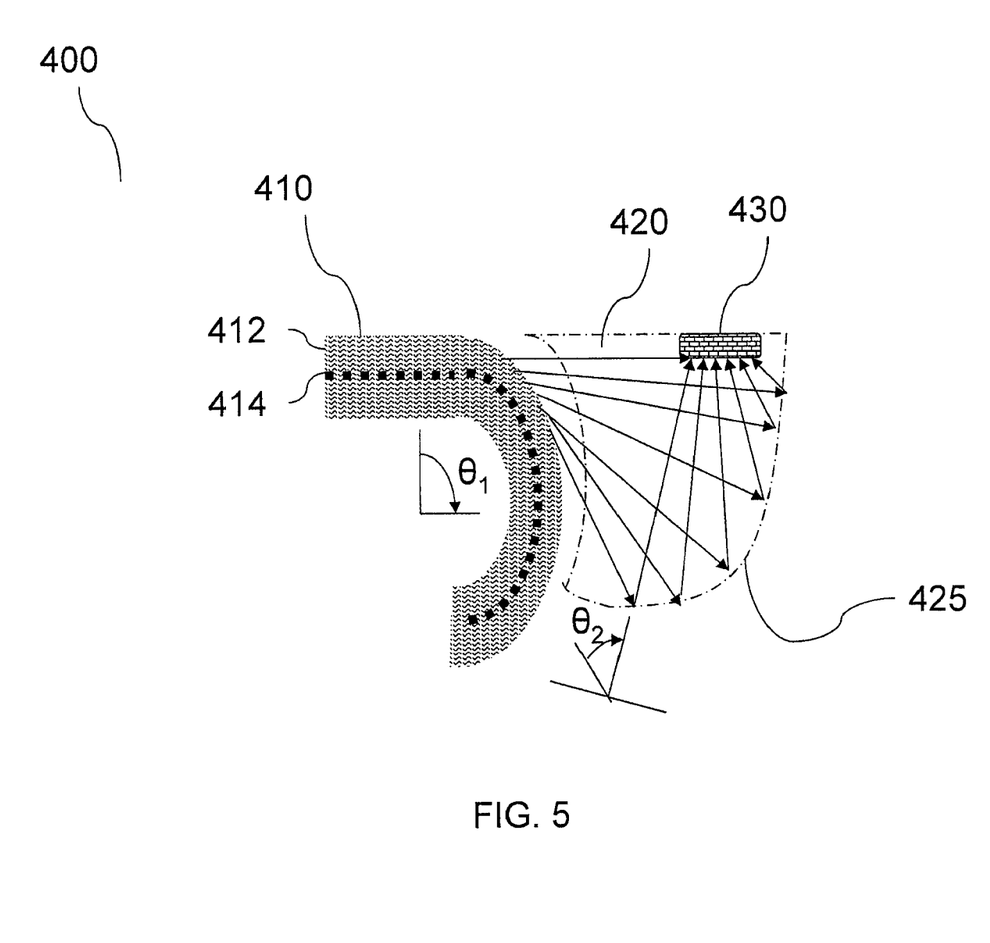
FIG. 5 illustrates a top-down view of optical paths in an optical connection, in accordance with embodiments described herein.

FIG. 5 illustrates a top-down view of the paths of evanescent waves propagating radially from optical waveguide 410 to photonic detector 420 in optical connection 400.

The semiconductor material used to form photonic detector 420 may be shaped to reflect the propagated evanescent waves to a common point (e.g., electrode 430). The semiconductor material may be shaped using, for example, a lithographic process, such as electron-beam lithography, or through etching techniques. The reflecting edge 425 of photonic detector 420 is preferably in a range of about 5-15 μm from optical waveguide 410, providing an adequate path length for the wavelengths of the propagated evanescent waves while allowing for a compact photonic detector 420.

The radially propagated evanescent waves received by photonic detector 420 can be reflected at a substantially uniform angle $\theta_2$ from edge 425 towards electrode 430. For example, the reflecting edge 425 of photonic detector 420 may be shaped to reflect the evanescent waves at approximately a 20° angle towards electrode 430. In other embodiments, angle $\theta_2$ may change as a function of its distance from optical waveguide 410. Selecting a common point for electrode 430 that is relatively close (i.e., within 10 μm) to optical waveguide 410 allows for a smoother reflecting edge 425, because complicated reflection points are not required.

In order to better promote reflectivity of the optical beams, the photonic detector 420 may be formed of a material having a higher refractive index than the surrounding substrate. For example, a germanium (Ge) photonic detector 420 having an index of refraction of approximately 4.34 may be used in a substrate of $SiO_2$, which has a refractive index of approximately 1.5. Other materials may also be used to form the photonic detector 420, such as InP, SiGe, GaAs, and other appropriate materials.

Figure 6:
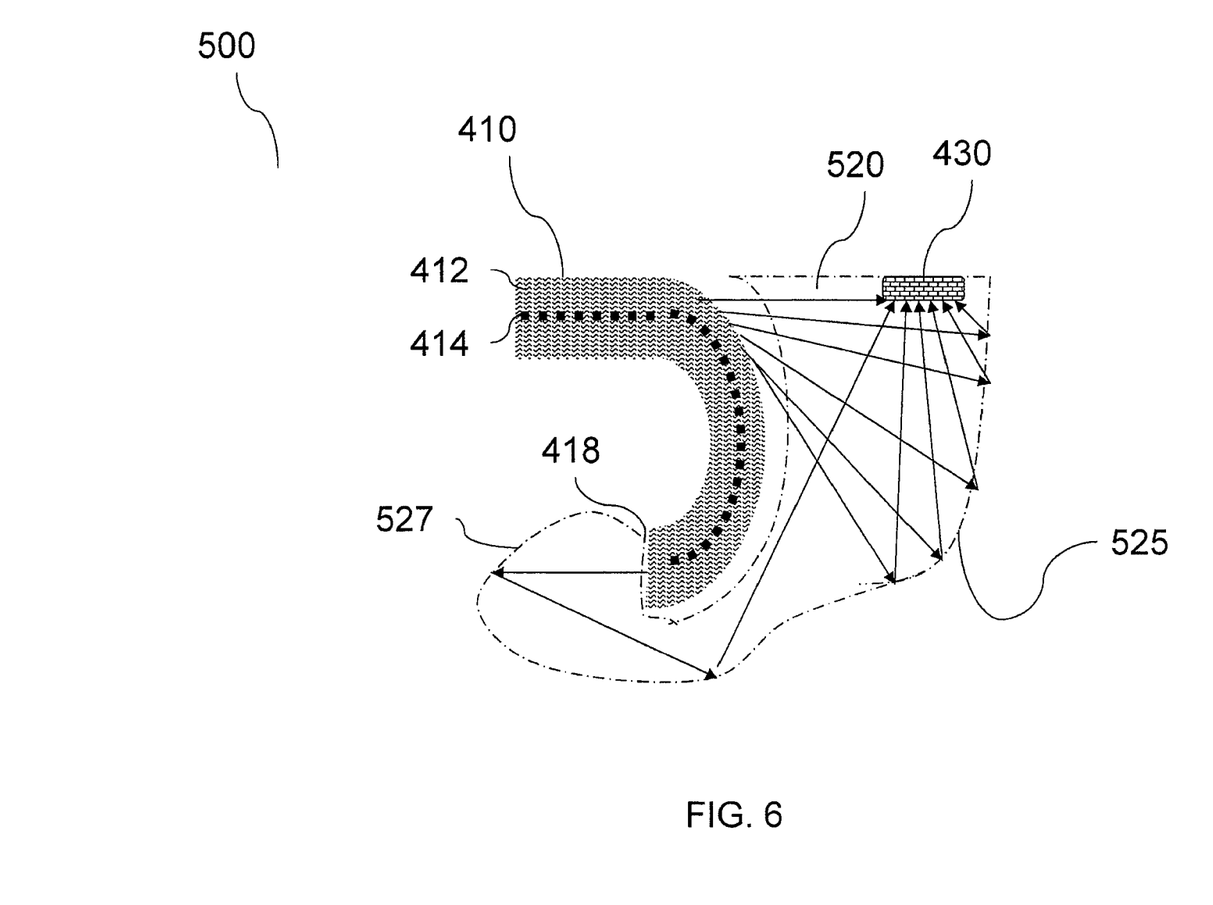
FIG. 6 illustrates a top-down view of optical paths in another optical connection, in accordance with embodiments described herein.

FIG. 6 illustrates a top-down view of optical paths in an optical connection 500 in another embodiment of a photonic detector 520. Photonic detector 520 includes a shaped reflecting edge 525 similar to edge 425 described above in connection with FIG. 4, in order to reflect evanescent waves propagated radially from optical waveguide 410 due to bending loss. In addition, a bottom portion of photonic detector 520 is butt-coupled to the terminal point 418 of optical waveguide 410, in order to couple any remaining optical beam from inner core 414 to photonic detector 520. The optical beam is reflected from another reflecting edge 527 of photonic detector 520, and may be reflected several times prior to reaching the common point (e.g., electrode 430). Photonic detector 520 may be fabricated using wafer bonding and other existing manufacturing processes such as complementary metal oxide semiconductor (CMOS) semiconductor manufacturing processes.

Optical connections including an optical waveguide 410 and/or a photonic detector 420, 520 as described in connection with FIGS. 4-6 may be used in various electronic-photonic devices. For example, the optical connections could be used with inter-chip or intra-chip systems including at least one light source 120 and modulator 140 (FIG. 1), such as to connect multiple memory elements (e.g., one or more cores or DRAM, SDRAM, SRAM, ROM, or other type of solid-state or static memory elements).

The above description and drawings are only to be considered illustrative of specific embodiments, which achieve the features and advantages described herein. Modification and substitutions to specific processes, components, and structures can be made. For example, it should be understood that appropriate types of semiconductor materials and memory elements other than those specifically described in connection with the above embodiments may be used. Accordingly, the embodiments of the invention are not to be considered as being limited by the foregoing description and drawings, but only by the scope of the appended claims.

What is claimed as new and desired to be protected by Letters Patent of the United States is:

1. A photonic detector comprising:
   a semiconductor material configured to receive an optical energy wave, wherein the semiconductor material comprises at least one curved reflecting edge shaped to reflect a plurality of evanescently received optical energy waves from sides of a curved waveguide to a common point.

2. The photonic detector of claim 1, wherein the common point comprises at least one electrode.

3. The photonic detector of claim 1, wherein the reflecting edge is in a range of about 5-15 μm from the waveguide.

4. The photonic detector of claim 1, wherein the photonic detector comprises at least one of the following materials:
   germanium;
   silicon germanium;
   indium gallium arsenide; and
   indium phosphate.

5. The photonic detector of claim 1, wherein the semiconductor material further comprises: an edge for receiving optical energy waves from an end surface of the curved waveguide, the at least one reflecting edge shaped to reflect optical energy waves from the end surface to the common point.

6. The photonic detector as in claim 1, wherein the curved edge is shaped to receive optical wave energy from a curved waveguide having a constant radius of curvature.

7. The photonic detector as in claim 6, wherein the constant radius of curvature is approximately 1 μm.

8. The photonic detector as in claim 1, wherein the curved edge is shaped to receive optical wave energy from a curved waveguide having a varying radius of curvature.

9. The photonic detector as in claim 1, wherein the received optical energy waves are reflected by the at least one curved reflecting edge at a substantially uniform angle.

10. The photonic detector as in claim 9, wherein the angle is approximately a 20° angle.

11. The photonic detector as in claim 1, wherein the received optical waves are reflected by the at least one curved reflecting edge at angles which change as a function of the distance of the at least one curved reflecting edge from the sides of the curved waveguide.

12. The photonic detector as in claim 1, wherein the common point is within 10 μm of the curved waveguide.

13. The photonic detector as in claim 1, wherein the photonic detector is used as part of an electronic memory.

\* \* \* \* \*